United States Patent
Tanaka

(10) Patent No.: US 9,117,665 B2
(45) Date of Patent: Aug. 25, 2015

(54) NONVOLATILE SEMICONDUCTOR MEMORY DEVICE AND MANUFACTURING METHOD THEREOF

(75) Inventor: Masayuki Tanaka, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 131 days.

(21) Appl. No.: 13/601,266

(22) Filed: Aug. 31, 2012

(65) Prior Publication Data

US 2013/0240976 A1 Sep. 19, 2013

(30) Foreign Application Priority Data

Mar. 19, 2012 (JP) ................................. 2012-062498

(51) Int. Cl.
*H01L 29/792* (2006.01)
*H01L 21/02* (2006.01)
*H01L 21/28* (2006.01)
*H01L 27/115* (2006.01)

(52) U.S. Cl.
CPC .... *H01L 21/02329* (2013.01); *H01L 21/28273* (2013.01); *H01L 27/11521* (2013.01); *H01L 29/792* (2013.01)

(58) Field of Classification Search
CPC ................... H01L 21/02329; H01L 21/28273; H01L 27/11521; H01L 29/792
USPC .......................................... 257/324; 438/466
See application file for complete search history.

(56) References Cited

U.S. PATENT DOCUMENTS 6,989,319 B1 *  1/2006  Ramsbey et al. ............. 438/520
7,485,918 B2     2/2009  Yamamoto et al.
2007/0241390 A1 * 10/2007 Tanaka et al. ................. 257/314
2007/0262372 A1 * 11/2007 Yamamoto et al. ........... 257/324
2007/0287253 A1 * 12/2007 Takeuchi et al. .............. 438/257
2008/0179655 A1    7/2008  Ishida et al.

(Continued)

FOREIGN PATENT DOCUMENTS

| JP | 8-78550 | 3/1996 |
|---|---|---|
| JP | 2007-305668 | 11/2007 |
| JP | 2007-311721 | 11/2007 |

(Continued)

OTHER PUBLICATIONS

Japanese Office Action issued Jun. 6, 2014, in Japan Patent Application No. 2012-062498 (with English translation).

*Primary Examiner* — William F Kraig
*Assistant Examiner* — Pavel Ivanov
(74) *Attorney, Agent, or Firm* — Oblon, McClelland, Maier & Neustadt, L.L.P.

(57) ABSTRACT

In accordance with an embodiment, a nonvolatile semiconductor memory device includes a substrate including a semiconductor layer including an active region, a first insulating film on the active region, a charge storage layer on the first insulating film, an element isolation insulating film defining the active region, a second insulating film, and a control electrode on the second insulating film. The top surface of the element isolation insulating film is placed at a height between the top surface and the bottom surface of the charge storage layer, thereby forming a step constituted of the charge storage layer and the element isolation insulating film. The second insulating film covers the step and the charge storage layer. The second insulating film includes a first silicon oxide film and a first silicon nitride film on the first silicon oxide film. Nitrogen concentration in the first silicon nitride film is non-uniform.

5 Claims, 8 Drawing Sheets

(56) References Cited

U.S. PATENT DOCUMENTS

2009/0011586 A1* 1/2009 Akahori et al. ............... 438/591
2011/0018048 A1* 1/2011 Tanaka et al. ................. 257/316
2012/0034772 A1   2/2012 Ishida et al.

FOREIGN PATENT DOCUMENTS

| JP | 2008-182104 | 8/2008 |
| JP | 2008-277694 | 11/2008 |
| JP | 2010-103414 | 5/2010 |

* cited by examiner

NONVOLATILE SEMICONDUCTOR MEMORY DEVICE AND MANUFACTURING METHOD THEREOF

CROSS REFERENCE TO RELATED APPLICATIONS

This application is based upon and claims the benefit of priority from the prior Japanese Patent Application No. 2012-062498, filed on Mar. 19, 2012, the entire contents of which are incorporated herein by reference.

FIELD

Embodiments described herein relate generally to a nonvolatile semiconductor memory device and a manufacturing method thereof.

BACKGROUND

In a floating gate electrode type nonvolatile semiconductor memory device, as an inter-electrode insulating film (IPD: Inter-Poly Dielectric) that insulates a Floating Gate (FG) and a Control Gate (CG) from each other, a laminated insulating film of a silicon oxide film/silicon nitride film/silicon oxide film (an ONO film) has been conventionally used. The silicon nitride film (an SiN film) in the ONO film does not have a perfect stoichiometric composition but a slightly silicon-excess composition because of its forming method. In the silicon-excess SiN film, a level for trapping electric charges is present, and hence some of electrons are trapped by the level in the SiN film even if the electrons leak at the time of application of an electric field (e.g., a write/erase operation). Further, a barrier height of the silicon nitride film is lower than a barrier height of the silicon oxide film, both the barrier of a track level in the SiN film and the barrier height of $SiO_2$ films formed to sandwich the SiN film serve as a barrier in the ONO laminated structure, whereby trapped electrons are hardly detrapped (leak) to the outside of the ONO insulating film.

An electric field applied to the inter-electrode insulating film must be reduced to be lower than that of a tunnel insulating film, leak to a control electrode side at the time of a write operation must be suppressed, injection (storage) of electros to a floating gate must be activated, and hence the inter-electrode insulating film is formed into a three-dimensional structure so that a high capacity can be assured even though a film thickness is large. As a result of taking the three-dimensional structure, a step is formed between the floating gate and an element isolation insulating film, and each corner portion (an edge portion) is present at a top portion of the floating gate and a bottom portion between cells. Since an electric field is concentrated on the edge portion, a leak current in the inter-electrode insulating film flows through the edge portion on a preferential basis at the time of a write/erase operation. As a result, electron trap into the inter-electrode insulating film more excessively occurs at the edge portion, and a concentration difference is produced in an electron trap amount in the continuously formed inter-electrode insulating film.

Although trapped electrons in the inter-electrode insulating film hardly leak to the outside of the ONO insulating film, redistribution in a transverse direction (a direction orthogonal to a thickness direction) occurs so that the concentration difference is eliminated in the inter-electrode insulating film. When the redistribution of the trapped electrons to the inter-electrode insulating film occurs while electric charges are held after end of the write/erase operation, a threshold value fluctuates, and charge retention characteristics are deteriorated.

DETAILED DESCRIPTION

Figure 1A:
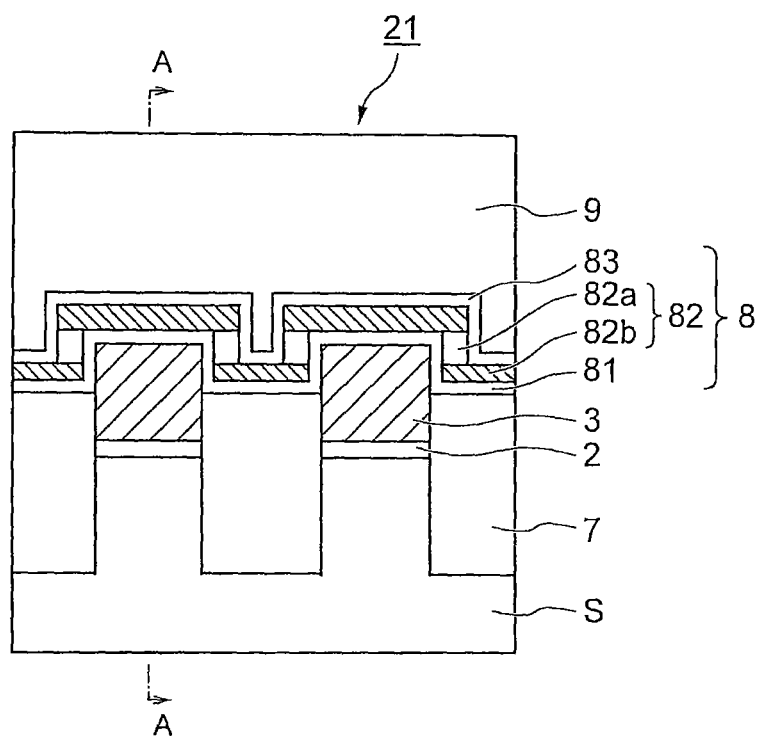
FIG. 1A is a cross-sectional view showing an outline configuration of a nonvolatile semiconductor memory device according to Embodiment 1.

In accordance with an embodiment, a nonvolatile semiconductor memory device includes a substrate, a first insulating film, a charge storage layer, an element isolation insulating film, a second insulating film, and a control electrode. The substrate includes a semiconductor layer which is formed thereon and includes an active region. The first insulating film is formed on the active region. The charge storage layer is formed on the first insulating film. The element isolation insulating film defines the active region in the semiconductor layer. The top surface of the element isolation insulating film is placed at a height between the top surface and the bottom surface of the charge storage layer, thereby forming a step constituted of the charge storage layer and the element isolation insulating film. The second insulating film covers the step and the charge storage layer. The control electrode is formed on the second insulating film. The second insulating film includes a first silicon oxide film and a first silicon nitride film on the first silicon oxide film. Nitrogen concentration in the first silicon nitride film is non-uniform.

Several embodiments will now be described hereinafter with reference to the drawings. A description will be given as to a nonvolatile semiconductor memory device including a memory cell array in which a plurality of memory cell columns having a plurality of memory cell transistors aligned in a column direction (a channel length direction) are arranged along a row direction (a channel width direction), and to a manufacturing method thereof. In the drawings, like refer- (A) Nonvolatile Semiconductor Memory Device (1) Embodiment 1

Figure 1B:
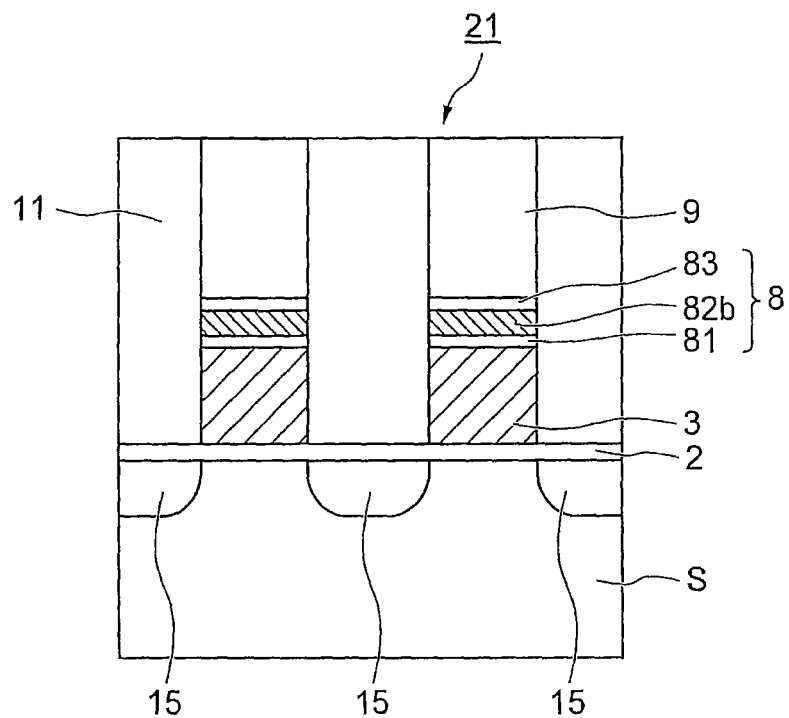
FIG. 1B is a cross-sectional view taken along a cutting-plane line A-A in FIG. 1A.

FIG. 1A and FIG. 1B are cross-sectional views sowing an outline configuration of a nonvolatile semiconductor memory device according to Embodiment 1. FIG. 1A is a cross-sectional view along a word line direction (a channel width direction), and FIG. 1B is a cross-sectional view of a bit line direction (a channel length direction) along a cutting-plane line A-A in FIG. 1A.

A nonvolatile semiconductor memory device 21 according to this embodiment includes a selection transistor having an impurity diffused region 15 as a source or a drain, a substrate S, element isolation insulating films 7, floating gate electrodes 3, inter-layer insulating films (IPD) 8, and control gate electrodes 9.

In this embodiment and the following embodiments, a silicon substrate is used as the substrate S. However, the substrate S is not restricted to a semiconductor substrate and, for example, a glass substrate or a ceramic substrate can be used as long as it has a semiconductor layer formed a surface thereof.

The element isolation insulating films 7 are formed on a surface layer of the substrate S in such a manner that they run in parallel to each other between the semiconductor substrate and a plurality of memory cell columns, thereby defining active regions. The floating gate electrode 3 is formed of a conductor on the active region through a tunnel insulating film 2. In this embodiment, the tunnel insulating film 2 corresponds to, e.g., a first insulating film, and the floating gate electrode 3 corresponds to, e.g., a charge storage layer.

Here, the element isolation insulating film 7 is formed in such a manner that its top surface is placed at a height between a top surface and a bottom surface of the floating gate electrode 3, whereby a step constituted of the floating gate electrode 3 and the element isolation insulating film 7 is formed on the substrate S. It is to be noted that reference numeral 11 denotes an inter-cell insulating film.

The inter-electrode insulating film (IPD) 8 is formed on a surface of the step constituted of the floating gate electrode 3 and the element isolation insulating film 7. In this embodiment, the inter-electrode insulating film (IPD) 8 corresponds to, e.g., a second insulating film.

The floating gate electrodes 3 are separated from each other by three-dimensional shapes of the element isolation insulating film 7 and the inter-electrode insulating film (IPD) 8.

The control gate electrode 9 is formed of a conductor on the inter-electrode insulating film (IPD) 8, and it serves as a wiring line common to memory cells adjacent to each other.

A selection transistor of the nonvolatile semiconductor memory device has a two-layer gate structure in which the impurity diffused regions 15 formed to sandwich a channel region therebetween in an active region of the substrate S in the columns direction is configured as source/drain regions, the conductor immediately above the tunnel insulating film 2 on the channel region is configured as the floating gate electrode 3, and the conductor formed on the inter-electrode insulating film (IPD) 8 on the floating gate electrode 3 is configured as the control gate electrode 9.

The inter-electrode insulating film (IPD) 8 is formed of a laminated film of a low-dielectric insulating film and a high-dielectric insulating film, and it is constituted of an ONO laminated film formed of $SiO_2$ (a silicon oxide film) 81/SiN film (a silicon nitride film) 82/$SiO_2$ (a silicon oxide film) 83 from the substrate S side in the mentioned order in this embodiment. Furthermore, the SiN film (the silicon nitride film 82) includes an Si-rich SiN film 82a and an SiN film 82b which has nitrogen concentration higher than that of the SiN film 82a and is closer to a stoichiometric composition.

In this embodiment, the SiN film 82b that is close to a stoichiometric composition is formed in a lower region immediately above a top surface of the element isolation insulating film 7 and in an upper region that covers the floating gate electrode in the SiN film 82.

The upper region that covers the floating gate electrode includes a region of a corner portion facing an edge of the floating gate electrode 3. With a concentration distribution in such a conformation, the inter-electrode insulating film (IPD) 8 is constituted of the ONO insulating film including the SiN film 82b having low track density at the corner portion where electron trap excessively occurs at the time of a write/erase operation of the floating gate electrode 3.

An electron trap amount of the SiN film (the silicon nitride film) is dependent on a composition of the SiN film (an Si/N ratio), and the trap density is increased as the composition contains silicon in larger excess (rich with silicon). To reduce the trap density in the SiN film, approximating an Si/N composition ratio to the stoichiometric composition can suffice, and this composition can be realized by introducing nitrogen. When the composition of the SiN film approximates to the stoichiometric composition, a trap level in the film is reduced, and hence a Poole-Frenkel type leak current via the trap can be decreased. In a conventional inter-electrode insulating film, although the leak is decreased by a self-electric field of electrons themselves trapped in the SiN film, insulation properties of the insulating film itself can be improved by realizing a silicon nitride film having the stoichiometric composition, thereby reducing the leak as the inter-electrode insulating film.

As described above, according to this embodiment, there is included the SiN film 82b which is formed in the lower region immediately above the top surface of the element isolation insulating film 7, in the upper region on the top surface of the floating gate electrode 3, and in an upper corner region covering the edge of the floating gate electrode 3 and which has nitrogen concentration close to the stoichiometric composition, and hence a configuration that trap density is low at each corner portion of the upper region and the lower region can be realized. As a result, redistribution of trapped electrons to any other region in the inter-electrode insulating film (IPD 8) can be suppressed, thereby improving charge retention characteristics of the element.

On the other hand, in the SiN film (the silicon nitride film) 82 of the inter-electrode insulating film (IPD) 8 according to this embodiment, the Si-rich SiN film 82a having trap properties is formed in a sidewall region along a side surface of the floating gate electrode 3. Therefore, an electric charge is trapped in the sidewall region along the side wall of the floating gate electrode 3, and a leak current amount on the sidewall can be reduced by self-electric field effect of the trapped electrons. When miniaturization of the semiconductor memory device further advances in the future, a top portion of the floating gate electrode 3 becomes small, and a ratio of the sidewall region in the inter-electrode insulating film (IPD) 8 is thereby increased. According to this embodiment, a distribution of nitrogen effective for suppressing of leak can be formed. Therefore, charge retention characteristics of the element can be improved while maintaining write/erase characteristics.

It is to be noted that FIG. 1A shows as if a clear boundary is present between the Si-rich SiN film 82a and the SiN film 82b having nitrogen concentration close to the stoichiometric composition, but the clear boundary is not actually formed, and non-uniform nitrogen concentration is distributed in accordance with a fabricating method of the element, a shape of the substrate, or a processing method. This point can be likewise applied to embodiments described below.

(2) Embodiment 2

Figure 2:
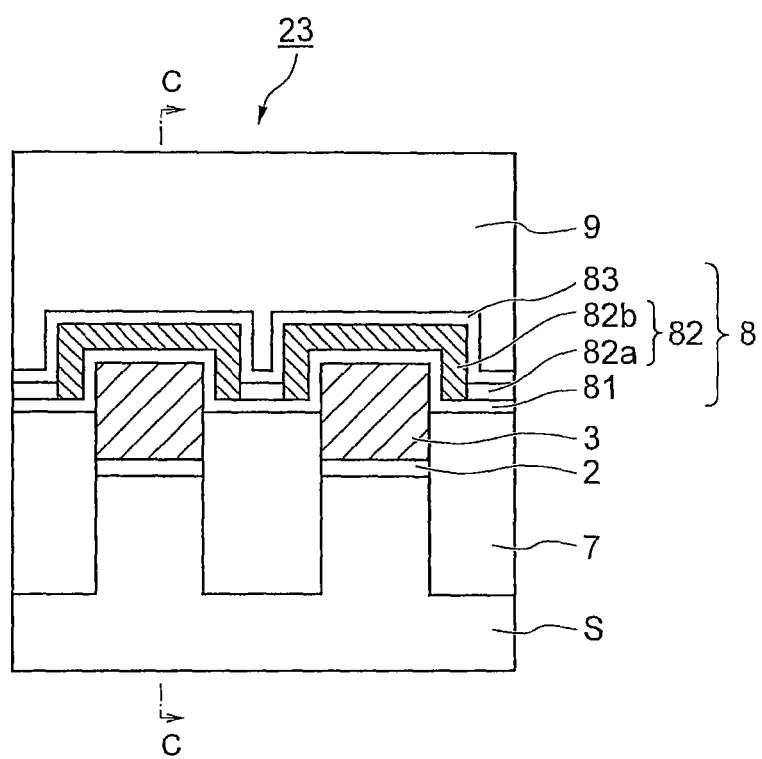
FIG. 2 is a cross-sectional view showing an outline configuration of a nonvolatile semiconductor memory device according to Embodiment 2.

FIG. 2 is a cross-sectional view showing an outline configuration of a nonvolatile semiconductor memory device according to Embodiment 2, and it is a cross-sectional view along a word line direction (a channel width direction). In this embodiment, a cross-sectional view in a bit line direction (a channel length direction), i.e., a cross-sectional view along a cutting-plane line C-C in FIG. 2 is the same as FIG. 1B, and hence it will be omitted.

As obvious from comparison with FIG. 1A, a nonvolatile semiconductor memory device 23 according to this embodiment includes an inter-electrode insulating film (IPD) 8 including an SiN film (a silicon nitride film) 82 in which an Si-rich SiN film 82a having strong trap properties is formed only in a region of a bottom portion between cells excluding a corner portion on an element isolation insulating film 7 and an SiN film 82b having nitrogen concentration close to the stoichiometric composition is formed in any other regions.

In the bottom portion between cells, although a maximum electric field is applied at the time of an erase operation, according to this embodiment, since the Si-rich SiN film 82a is formed in the region excluding the corner portion on the element isolation insulating film 7, a leak current can be reduced by a self-electric field based on electron trap. As a result, erase characteristics can be improved.

(3) Embodiment 3

Figure 3A:
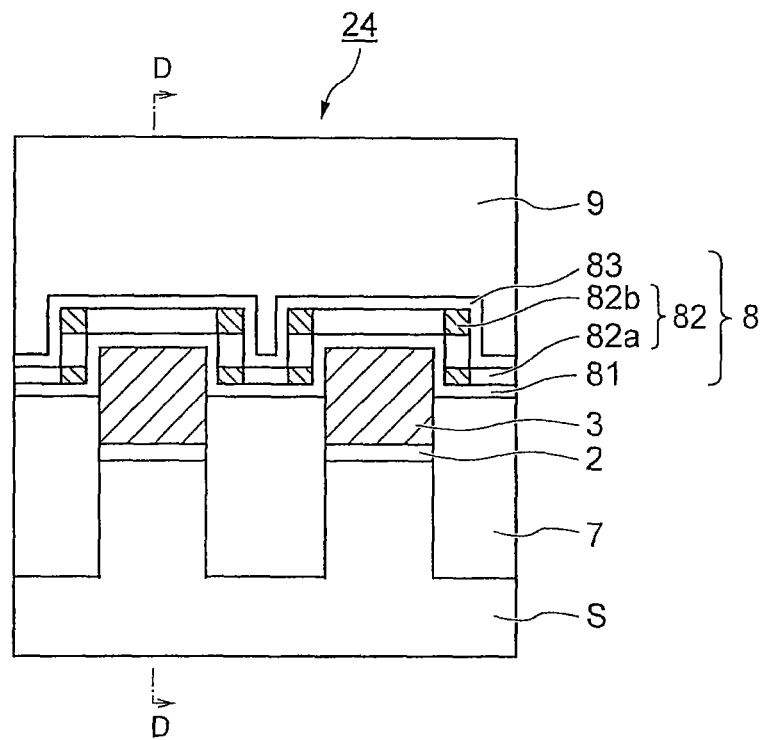
FIG. 3A is a cross-sectional view showing an outline configuration of a nonvolatile semiconductor memory device according to Embodiment 3.
Figure 3B:
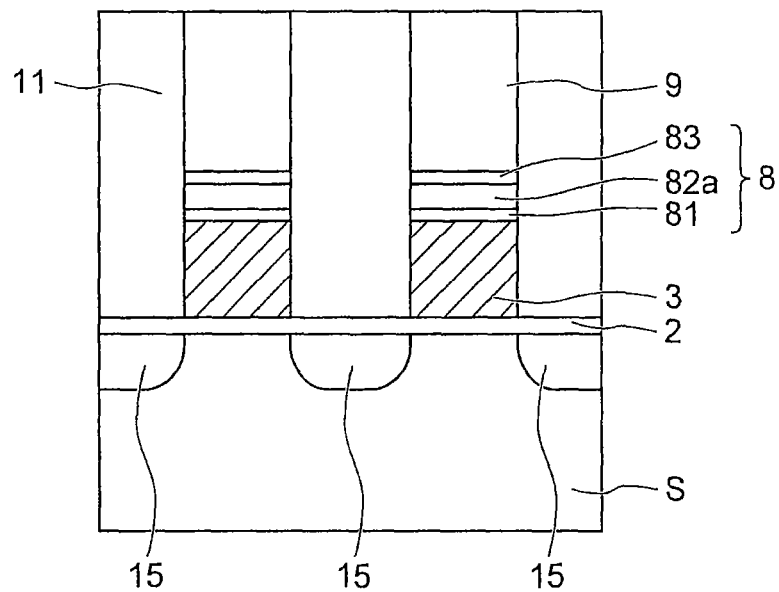
FIG. 3B is a cross-sectional view taken along a cutting-plane line D-D in FIG. 3A.

FIG. 3A and FIG. 3B are cross-sectional views showing an outline configuration of a nonvolatile semiconductor memory device according to Embodiment 3. FIG. 3A is a cross-sectional view along a word line direction (a channel width direction), and FIG. 3B is a cross-sectional view of a bit line direction (a channel length direction) along a cutting-plane line D-D in FIG. 3A.

As obvious from comparison with FIG. 1A, in an inter-electrode insulating film (IPD) 8 included in a nonvolatile semiconductor memory device 24 according to this embodiment, an SiN film 82b having nitrogen concentration close to a stoichiometric composition is formed only at each corner portion of a flat upper region and of a flat lower region, and an Si-rich SiN film 82a having strong trap properties is formed in any other regions.

According to this embodiment, since trapped electrons can be reduced only in the corner portions, a self-electric field effect based on electron trap can be obtained at a maximum. As a result, it is possible to achieve both improvement in write/erase characteristics and improvement in charge retention characteristics.

(4) Embodiment 4

Figure 4:
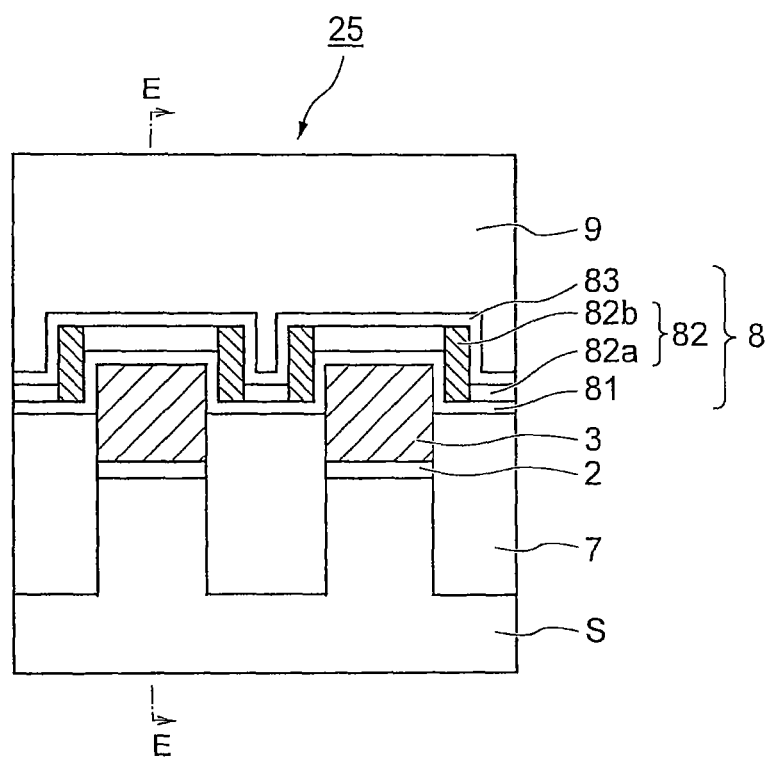
FIG. 4 is a cross-sectional view showing an outline configuration of a nonvolatile semiconductor memory device according to Embodiment 4.
Figure 5:
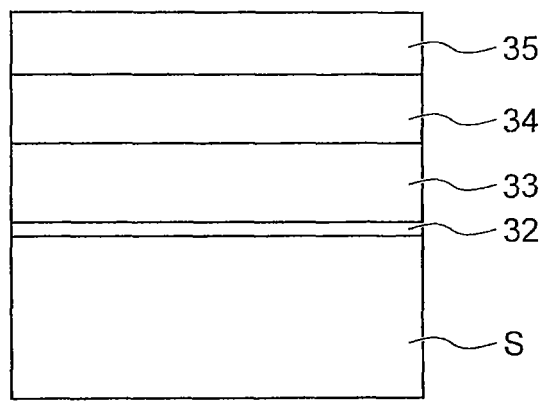
FIG. 5 to FIG. 9 are cross-sectional views showing a manufacturing method of a nonvolatile semiconductor memory device according to Embodiment 1.

FIG. 4 is a cross-sectional view showing an outline configuration of a nonvolatile semiconductor memory device according to Embodiment 4, and it is a cross-sectional view along a word line direction (a channel width direction). In this embodiment, a cross-sectional view of a bit line direction (a channel length direction), i.e., a cross-sectional view along a cutting-plane line E-E in FIG. 4 is equal to FIG. 3B, and hence this view will be omitted.

As obvious from comparison with FIG. 1A, in an inter-electrode insulating film (IPD) 8 included in a nonvolatile semiconductor memory device 25 according to this embodiment, an SiN film 82b having nitrogen concentration close to a stoichiometric composition is formed in a sidewall region along a side surface of each floating gate electrode 3 in addition to each corner portion of a flat upper region and of a flat lower region. In all of any other regions, i.e., a region above a top portion of the floating gate electrode 3 and a region of a bottom portion between cells excluding the corner portions, an Si-rich SiN film 82a having strong trap properties is formed.

According to this embodiment, electrons trapped in the SiN film (a silicon nitride film) 82 can be suppressed from moving in a direction vertical to a surface of a silicon substrate S. The movement in the direction vertical to the surface of the substrate S has the greatest influence on a fluctuation in a threshold of a device. Therefore, suppression of electron movement according to this embodiment is very effective.

According to the nonvolatile semiconductor memory device of at least one of the embodiments described above, since the inter-electrode insulating film (IPD) 8 including the SiN film (the silicon nitride film) 82 having non-uniform nitrogen concentration is provided, redistribution of trapped electrons in the inter-electrode insulating film (IPD) 8 can be avoided, and the semiconductor memory device having excellent charge retention characteristics can be provided.

(B) Manufacturing Method of Nonvolatile Semiconductor Memory Device

The nonvolatile semiconductor memory devices according to Embodiments 1 to 4 can be manufactured by the following method.

(1) Embodiment 1

The nonvolatile semiconductor memory device 21 shown in FIG. 1 can be manufactured by introducing nitrogen so as to cover each flat region including a corner portion of the SiN film (a silicon nitride film) 82. This method will now be described hereinafter in detail with reference to FIG. 5 to FIG. 9.

First, a p-type silicon substrate is prepared as a substrate S. In place of the p-type silicon substrate, a substrate obtained by forming a p-type well on an n-type silicon substrate may be prepared.

Moreover, an insulating film, e.g., a silicon oxide film 32 with a thickness of approximately 1 nm to approximately 15 nm is formed on the substrate S, a conductive layer 33 serving as a floating gate electrode 3 with a thickness of approximately 10 nm to approximately 50 nm is then formed thereon by a chemical vapor deposition method. A silicon nitride film 34 is then formed with a film thickness of approximately 50 nm to approximately 200 nm by the chemical vapor deposition method, and subsequently a silicon oxide film 35 with a thickness of approximately 50 nm to approximately 400 nm is formed by the chemical vapor deposition method. As a result, a configuration shown in a cross-sectional view of FIG. 5 can be obtained.

Then, a photoresist (not shown) is applied to the upper side of the silicon oxide film 35, and the resist is patterned by pattern exposure. Subsequently, the silicon oxide film 35 is selectively removed by etching where the photoresist (not shown) is used as an etching resistance mask. The photoresist is removed after the etching, the silicon nitride film 34 is selectively removed by etching where the silicon oxide film 35 is used as a mask, and then the conductive layer 33, the silicon oxide film 32, and the substrate S are selectively removed by etching, thereby forming a trench TR (see FIG. 6) for element isolation. As a result, the silicon oxide film 32 turns to a silicon oxide film 2, the conductive layer 33 turns to a conductive layer 3, the silicon nitride film 34 turns to a silicon nitride film 4, and the silicon oxide film 35 turns to a silicon oxide film 5.

Figure 6:
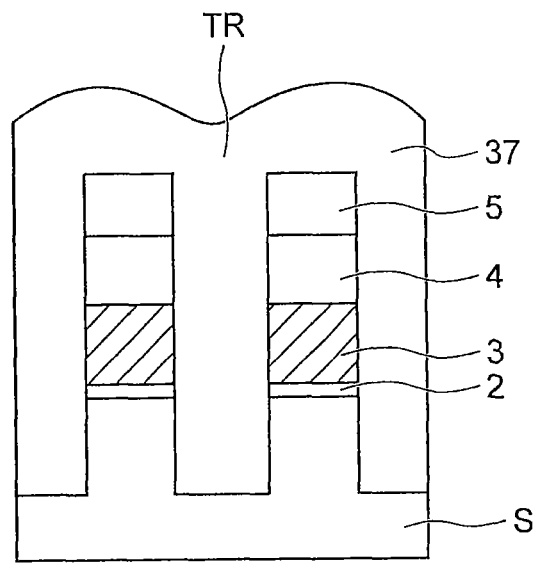

Subsequently, a buried insulating film 37 with a thickness of 200 nm to 1500 nm is formed by a coating technique to fill the element isolation trench TR, thus obtaining a configuration depicted in a cross-sectional view of FIG. 6.

Figure 7:
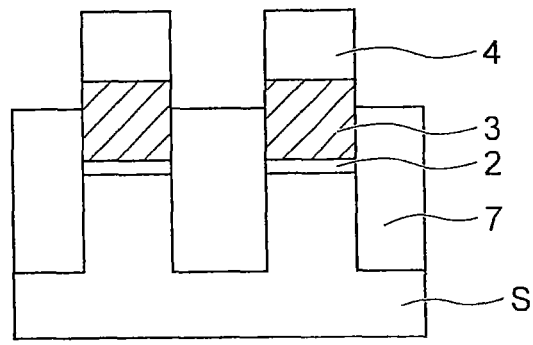

An element isolation insulating film 7 obtained by coating is subjected to a treatment in an oxygen atmosphere or a water-vapor atmosphere to achieve density growth. Then, the silicon oxide film 4 is used as a stopper, and the element isolation insulating film 37 and the silicon oxide film 5 are removed by a Chemical Mechanical Polishing (CMP) to effect flattening. Subsequently, the element isolation insulating film 37 alone is etched back under etching conditions having a selection ratio with respect to the silicon nitride film 4, whereby a configuration depicted in a cross-sectional view of FIG. 7 is obtained. As a result, the buried insulating film 37 turns to an element isolation insulating film 7.

Figure 8:
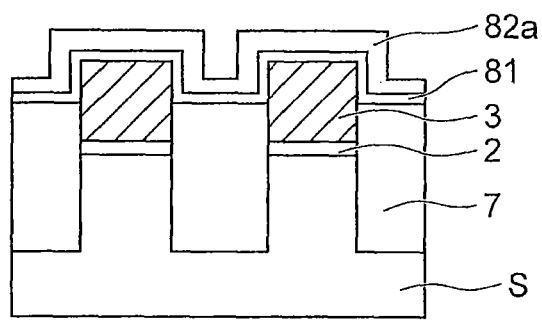

Then, a silicon oxide film 81 with a film thickness of approximately 1 nm to approximately 10 nm is formed at approximately 550° C. in accordance with an Atomic Layer Deposition (ALD) method by use of trisdimethylaminosilane and ozone (see FIG. 8). For example, nitrogen monoxide ($N_2O$) may be reacted at a temperature of approximately 800° C. to form the silicon oxide film 81 by a low-pressure chemical vapor deposition (LP-CVD) method in place of the atomic layer deposition (ALD).

Then, a silicon nitride film 82a with a film thickness of approximately 1 nm to approximately 5 nm is formed on the silicon oxide film 81, and a configuration shown in a cross-sectional view of FIG. 8 is obtained. The silicon oxide film 81 and the silicon nitride film 82a may be continuously formed in a furnace.

Subsequently, the silicon nitride film 82a is re-nitrided using an anisotropic nitriding method. As re-nitriding conditions, microwaves are generated in an atmosphere containing a nitrogen gas to produce a nitrogen radical, and this nitrogen radical is used to re-nitride the silicon nitride film 82a. Microwave intensity at this moment is 100 W to 3000 W, a process pressure is 5 Pa to 30 Pa, and a substrate temperature is 350° C. to 900° C. To draw nitrogen ions to a sample, a bias voltage of approximately 0.1 to approximately 1 kW is applied to the substrate S.

Figure 9:
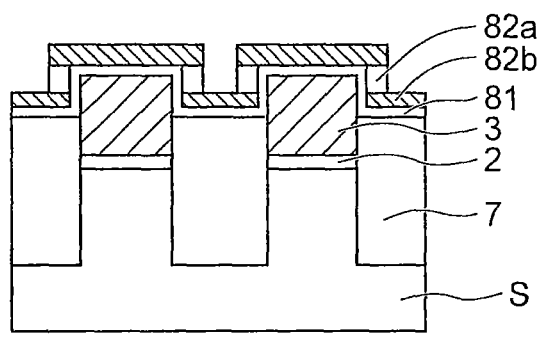

A film thickness of the silicon nitride film 82a formed when the substrate S is processed under the above-described conditions is 1 nm to 10 nm. When the anisotropic nitriding method is used, as shown in FIG. 9, a nitrogen introducing amount is large in a flat upper region and a flat lower region including respective corner portions and, on the other hand, it is small in a sidewall region along a sidewall of the floating gate electrode 3. When the bias voltage is applied to the substrate S, the nitrogen introducing amount can be increased, and anisotropic nitriding can be carried out. Nitrogen can be introduced by any other method, e.g., an ion implantation method.

Figure 10:
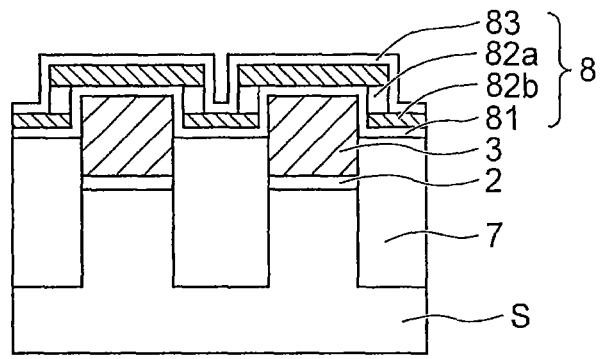
FIG. 10 is a cross-sectional view showing a manufacturing method of a nonvolatile semiconductor memory device according to Embodiment 1.

Then, a silicon oxide film 83 with a film thickness of approximately 1 nm to approximately 10 nm is formed at approximately 550° C. in accordance with the atomic layer deposition (ALD) method using trisdimethylaminosilane and ozone, thereby obtaining a configuration shown in a cross-sectional view of FIG. 10. In this stage, densification for density growth or improvement of an interface of the inter-electrode insulating film (IPD) 8 or an oxidation treatment for oxygen compensation or improvement of the interface of the same may be carried out. The silicon oxide film 83 may be formed by reacting dichlorosilane ($SiH_2Cl_2$) and nitrogen monoxide ($N_2O$) at a temperature of approximately 800° C. by the low-pressure chemical vapor deposition (LP-CVD) method.

Then, a conductive layer is formed on the entire surface of the inter-electrode insulating film (IPD) 8, this conductive layer is patterned by pattern exposure, a control gate electrode 9 (see FIG. 1A) is formed, and then a nonvolatile semiconductor memory device 21 shown in FIG. 1A and FIG. 1B is obtained through a regular post-process.

(2) Embodiment 2

A manufacturing method of a nonvolatile semiconductor memory device 23 shown in FIG. 2 will now be described. A step of forming a laminated body including a silicon oxide film 32, a conductive layer 33, a silicon nitride film 34, and a silicon oxide film 35 on a substrate S to a step of forming a silicon oxide film 81 on a floating gate electrode 3 and an element isolation insulating film 7 are the same as those in the manufacturing method according to Embodiment 1 (FIG. 5 to FIG. 8).

Figure 11:
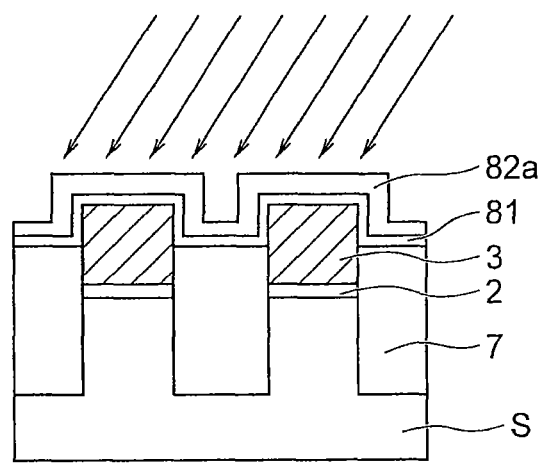
FIG. 11 and FIG. 12 are cross-sectional views showing a manufacturing method of a nonvolatile semiconductor memory device according to Embodiment 2.

A substrate having a silicon-rich silicon nitride film 82a formed on an entire surface thereof as shown in FIG. 8 is subjected to a nitrogen introducing treatment. Nitrogen is introduced by an ion implantation method as shown in FIG. 11, and nitrogen is introduced with implantation energy of 1 keV to 200 keV, an implantation angle of 15 degrees or above, and an implantation amount of approximately $1 \times 10^{11}$ to $1 \times 10^{15}$. Increasing the implantation angle enables suppressing the nitrogen introduction to a bottom portion between cells and obtaining a distribution in which a nitrogen introducing amount to a region along a sidewall of the floating gate electrode 3 and an upper region covering the floating gate electrode 3 is increased.

Figure 12:
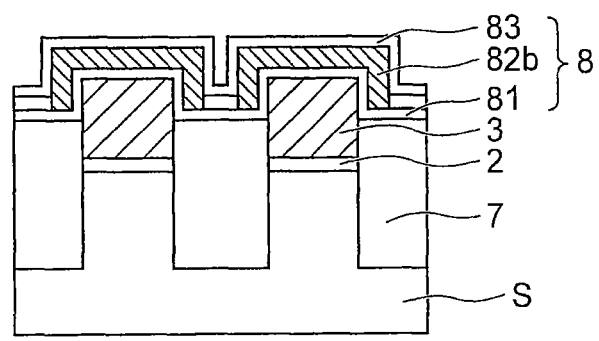

Then, as shown in FIG. 12, a silicon oxide film 83 with a film thickness of approximately 1 nm to approximately 10 nm is formed by the atomic layer deposition (ALD) method or the low-pressure chemical vapor deposition (LP-CVD) method. In this stage, densification for density growth or improvement of an interface of an inter-electrode insulating film (IPD) 8 or an oxidation treatment for oxygen compensation or improvement of the interface of the same may be carried out. Then, the same method as that described in Embodiment 1 is used, and the configuration shown in the cross-sectional view of FIG. 2 can be obtained.

(3) Embodiment 3

A manufacturing method of a nonvolatile semiconductor memory device 24 shown in FIG. 3A and FIG. 3B will now be described.

Figure 13:
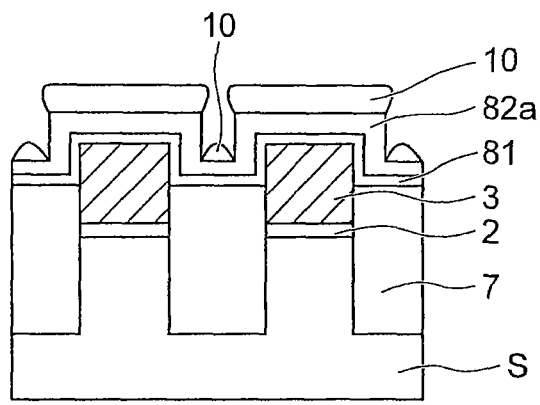
FIG. 13 and FIG. 14 are cross-sectional views showing a manufacturing method of a nonvolatile semiconductor memory device according to Embodiment 3.

A step of forming a laminated body including a silicon oxide film 32, a conductive layer 33, a silicon nitride film 34, and a silicon oxide film 35 on a substrate S to a step of forming a silicon oxide film 81 on a floating gate electrode 3 and an element isolation insulating film 7 are the same as those in the manufacturing method according to Embodiment 1 (FIG. 5 to FIG. 8). When a film forming method with poor step coverage, e.g., a high density plasma (HDP) CVD method is applied to a substrate having a silicon-rich silicon nitride film 82a formed on an entire surface thereof as shown in FIG. 8, a silicon oxide film 10 with a film thickness of approximately 5 nm to approximately 20 nm is formed, and a configuration shown in a cross-sectional view of FIG. 13 is obtained.

As compared with the LP-CVD method, the HDP-CVD method can easily control a profile of an oxide film to be formed. More specifically, in an HDP-CVD apparatus, adjusting high-density plasma power from a non-illustrated upper electrode (an ICP coil) and RF bias power from a non-illustrated lower electrode enables extensively controlling the step coverage of the oxide film. According to this method, the silicon oxide film 10 can be formed on a flat portion (a region above a top portion of a floating gate electrode 3 and a bottom portion between cells) alone without being formed on a sidewall of the floating gate electrode 3.

Then, the silicon oxide film 10 is slimmed by etching using a chemical having a selection ratio with respect to the silicon nitride film 82a. As a result, in the silicon nitride film 82a, corner portions of a flat upper region covering the floating gate electrode 3 and corner portions of a flat lower region of the bottom portion between cells are exposed. In this state, a nitrogen introduction treatment is performed. As nitriding conditions, microwaves are generated in an atmosphere containing a nitrogen gas to produce a nitrogen radical, and this nitrogen radical is used to further re-nitride the silicon nitride film 82a. As a result, of the exposed portions, nitrogen is introduced to the respective corner portions of the upper region and the lower region excluding the sidewall portion. Intensity of the microwaves at this time is 100 W to 3000 W, a process pressure is 5 Pa to 30 Pa, and a substrate temperature is 350° C. to 900° C. A bias voltage of approximately 0.1 kW to approximately 1 kW is applied to the substrate S to draw nitrogen ions to a sample. Under such conditions, a film thickness of the silicon nitride film formed when processing the Si substrate is 1 nm to 10 nm.

Nitrogen can be introduced by any other method, e.g., an ion implantation method or a plasma doping method. When introducing nitrogen, since the silicon oxide film 10 serves as a mask material, nitrogen can be introduced to the exposed corners alone.

Figure 14:
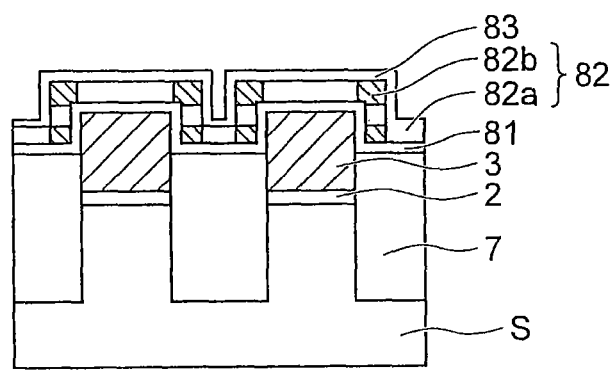

Then, etching using a chemical having a selection ratio with respect to the silicon nitride film 82 is performed, the silicon oxide film 10 is removed, and a silicon oxide film 83 having a film thickness of approximately 1 nm to approximately 10 nm is subsequently formed by the atomic layer deposition (ALD) or the low-pressure chemical vapor deposition (LP-CVD) method, thereby obtaining a structural cross-sectional view depicted in FIG. 14.

In this stage, densification for density growth or improvement of an interface of the inter-electrode insulating film (IPD) 8 or an oxidation treatment for oxygen compensation or improvement of the interface of the same may be carried out. Thereafter, the same method as that described in Embodiment 1 is used, and a configuration shown in the cross-sectional view of FIG. 3 is obtained.

(4) Embodiment 4

A manufacturing method of a nonvolatile semiconductor memory device 25 depicted in FIG. 4 will now be described.

A step of forming a laminated body including a silicon oxide film 32, a conductive layer 33, a silicon nitride film 34, and a silicon oxide film 35 on a substrate S to a step of forming a silicon oxide film 81 on a floating gate electrode 3 and an element isolation insulating film 7 are the same as those in the manufacturing method according to Embodiment 1 (FIG. 5 to FIG. 8). Further, when a film forming method with poor step coverage, e.g., a high-density plasma (HDP) CVD method is applied to a substrate having a silicon-rich silicon nitride film 82a formed on an entire surface thereof as shown in FIG. 8, a silicon oxide film 10 with a film thickness of approximately 5 nm to approximately 20 nm is formed, a configuration shown in a cross-sectional view of FIG. 13 is obtained, and this method is the same as Embodiment 3.

Then, the silicon oxide film 10 is slimmed by etching using a chemical having a selection ratio with respect to the silicon nitride film 82a. As a result, corner portions of a flat upper region covering the floating gate electrode 3 and corner portions of a flat lower region of the bottom portion between cells are exposed. In this state, a nitrogen introduction treatment is performed.

As nitriding conditions, for example, it is possible to use a method of performing a treatment in a temperature range of 600° C. to 1000° C. by using ammonia or a method of introducing nitrogen by oblique implantation. When introducing nitrogen, since the silicon oxide film 10 serves as a mask material, nitrogen can be uniformly introduced to exposed sidewall portions including upper and lower corner portions.

Figure 15:
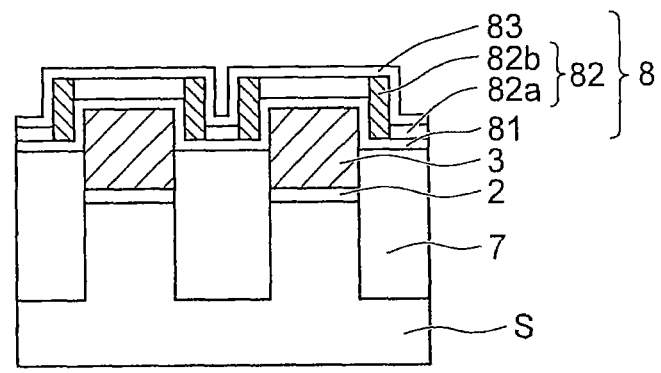
FIG. 15 is a cross-sectional view showing a manufacturing method of a nonvolatile semiconductor memory device according to Embodiment 4.

Then, etching using a chemical having a selection ratio with respect to the silicon nitride film 82a is performed, the silicon oxide film 10 is removed, and a silicon oxide film 83 having a film thickness of approximately 1 nm to approximately 10 nm is subsequently formed by the atomic layer deposition (ALD) or the low-pressure chemical vapor deposition (LP-CVD) method, thereby obtaining a structural cross-sectional view depicted in FIG. 15. In this stage, densification for density growth or improvement of an interface of the inter-electrode insulating film (IPD) 8 or an oxidation treatment for oxygen compensation or improvement of the interface of the same may be carried out. Thereafter, the same method as that described in Embodiment 1 is used, and a configuration shown in the cross-sectional view of FIG. 4 is obtained.

According to at least one of the manufacturing method of a nonvolatile semiconductor memory device described above, since the step of introducing nitrogen to the silicon nitride film 82 so as to obtain non-uniform nitrogen concentration is provided, redistribution of trapped electrons in the inter-electrode insulating film (IPD) 8 is avoided, and the semiconductor memory device having excellent charge retention characteristics can be manufactured.

Although the several embodiments according to the present inventions have been described, these embodiments are presented as examples, and restricting the scope of the inventions is not intended.

For example, in the foregoing embodiments, although the laminated insulating film having three layers constituted of the silicon oxide film/silicon nitride film/silicon oxide film (ONO) has been described as the inter-electrode insulating film (IPD) 8, the present inventions are not restricted thereto. In addition to the ONO structure, the present inventions are also effective to inter-electrode insulating films (IPD) such as a silicon nitride film/silicon oxide film/silicon nitride film/ silicon oxide film (NONO), a silicon oxide film/silicon nitride film/silicon oxide film/silicon nitride film (ONON), a silicon nitride film/silicon oxide film/silicon nitride film/silicon oxide film/silicon nitride film (NONON), and others.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory device comprising:
   a substrate comprising a semiconductor layer thereon, the semiconductor layer comprising an active region;
   a first insulating film on the active region of the semiconductor layer;
   a charge storage layer on the first insulating film;
   an element isolation insulating film defining the active region in the semiconductor layer, a top surface of the element isolation insulating film being placed at a height between a top surface and a bottom surface of the charge storage layer, thereby forming a step constituted of the charge storage layer and the element isolation insulating film;
   a second insulating film covering the step and the charge storage layer; and
   a control electrode on the second insulating film,
   wherein the second insulating film comprises a first silicon oxide film and a first silicon nitride film on the first silicon oxide film, and
   wherein the nitrogen concentration in the first silicon nitride film is higher in an upper region covering the charge storage layer and a lower region on the element isolation insulating film than any other regions.

2. The device of claim 1,
   wherein the second insulating film further comprises a second silicon oxide film on the first silicon nitride film.

3. The device of claim 2,
   wherein the second insulating film further comprises a second silicon nitride film on the second silicon oxide film.

4. The device of claim 2,
   wherein the second insulating film further comprises a third silicon nitride film on the first silicon oxide film.

5. The device of claim 4,
   wherein the second insulating film further comprises a fourth silicon nitride film on the second silicon oxide film.

* * * * *